United States Patent
Nagashima et al.

(10) Patent No.: US 11,328,908 B2
(45) Date of Patent: May 10, 2022

(54) ADJUSTMENT METHOD FOR FILTER UNIT AND PLASMA PROCESSING APPARATUS

(71) Applicant: TOKYO ELECTRON LIMITED, Tokyo (JP)

(72) Inventors: Nozomu Nagashima, Miyagi (JP); Ryuichi Yui, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 116 days.

(21) Appl. No.: 16/564,622

(22) Filed: Sep. 9, 2019

(65) Prior Publication Data

US 2020/0126772 A1 Apr. 23, 2020

(30) Foreign Application Priority Data

Oct. 19, 2018 (JP) .............................. JP2018-197855

(51) Int. Cl.
*H03H 11/30* (2006.01)
*H01J 37/32* (2006.01)
(Continued)

(52) U.S. Cl.
CPC .. *H01J 37/32724* (2013.01); *H01J 37/32174* (2013.01); *H01J 37/32798* (2013.01); *H01L 21/3065* (2013.01); *H01L 21/67069* (2013.01); *H01L 21/67103* (2013.01); *H01L 21/6833* (2013.01); *H01L 22/20* (2013.01); *H03H 7/0115* (2013.01); *H03H 7/0153* (2013.01);
(Continued)

(58) Field of Classification Search
CPC ........... H01J 37/32724; H01J 37/32174; H01J 7/32798; H01J 2237/334; H01L 21/3065; H01L 21/67069; H01L 21/67103; H01L 21/6833; H01L 22/20; H03H 7/0115; H03H 7/0153; H03H 7/40; H03H 11/30; H05H 1/36; H05H 1/46

See application file for complete search history.

(56) References Cited

U.S. PATENT DOCUMENTS

| 10,043,636 | B2 * | 8/2018 | Kim | H01J 37/32091 |
| 10,637,427 | B2 * | 4/2020 | Kapoor | H02M 1/44 |
| 2018/0342375 | A1 * | 11/2018 | Nguyen | H01J 37/32183 |

FOREIGN PATENT DOCUMENTS

JP 2011-135052 A 7/2011

* cited by examiner

*Primary Examiner* — Dinh T Le
(74) *Attorney, Agent, or Firm* — Weihrouch IP

(57) ABSTRACT

An adjustment method for filter units in a plasma processing apparatus includes a first measurement process of measuring a frequency characteristic of a reference filter unit selected among the filter units, and an adjustment process of adjusting a frequency characteristic of each of remaining filter units selected among the filter units excluding the reference filter unit. Further, the adjustment process includes an attachment process of attaching a capacitive member for adjusting a capacitance between wirings in each of the remaining filter units, a second measurement process of measuring a frequency characteristic of each of the remaining filter units to which the capacitive member is attached, and an individual adjustment process of adjusting a capacitance of the capacitive member such that the frequency characteristic of each of the remaining filter unit to which the capacitive member is attached becomes close to the frequency characteristic of the reference filter unit.

13 Claims, 14 Drawing Sheets

(51) Int. Cl.
  *H01L 21/67*      (2006.01)
  *H01L 21/3065*    (2006.01)
  *H01L 21/66*      (2006.01)
  *H01L 21/683*     (2006.01)
  *H05H 1/46*       (2006.01)
  *H05H 1/36*       (2006.01)
  *H03H 7/01*       (2006.01)
  *H03H 7/40*       (2006.01)

(52) U.S. Cl.
  CPC ............... *H05H 1/36* (2013.01); *H05H 1/46* (2013.01); *H01J 2237/334* (2013.01); *H03H 7/40* (2013.01); *H03H 11/30* (2013.01)

ADJUSTMENT METHOD FOR FILTER UNIT AND PLASMA PROCESSING APPARATUS

CROSS-REFERENCE TO RELATED APPLICATIONS

This application claims priority to Japanese Patent Application No. 2018-197855, filed on Oct. 19, 2018, the entire contents of which are incorporated herein by reference.

TECHNICAL FIELD

Various aspects and embodiments of the present disclosure relate to an adjustment method for a filter unit and a plasma processing apparatus.

BACKGROUND

In a semiconductor device manufacturing process, a processing using plasma (hereinafter, referred to as plasma processing) may be performed. A plasma processing apparatus for the plasma processing includes, e.g., a chamber, a stage and a high frequency power supply and the like. In the plasma processing, a processing gas supplied into the chamber is excited by a high frequency power supplied into the chamber through the stage, and the plasma is generated. Then, the plasma processing such as etching, film formation or the like is performed on a target object mounted on the stage by the plasma thus generated.

Further, in the plasma processing apparatus, a heater may be embedded in the stage in order to control the temperature of the target object. A heater controller is connected to the heater to control a heating amount of the heater by controlling power supplied to the heater. In this plasma processing apparatus, the high frequency power supplied to the stage may flow into the heater controller through the heater, which may result in a failure or a malfunction of the heater controller. Therefore, a filter is provided in a wiring between the heater and the heater controller to remove high frequency power components. As an example of the filter, a distributed constant type filter including a passive component such as a coil may be used.

In addition, in order to increase the control accuracy of a temperature distribution of the target object, the stage may be divided into a plurality of regions and the heaters respectively provided in the regions may be controlled independently (See, e.g., Japanese Patent Application Publication No. 2011-135052).

SUMMARY

The present disclosure provides an adjustment method for a filter unit and a plasma processing apparatus that can reduce the difference in frequency characteristics between filter units connected to electric members.

In accordance with an aspect of the present disclosure, there is provided an adjustment method for filter units in a plasma processing apparatus including multiple electrical members provided in a chamber in which a target object is processed by a generated plasma, and one or more external circuits provided outside the chamber and connected to the multiple electrical members through the filter units each of which includes one or more coils and a metal housing that covers a filter provided therein, the adjustment method including: a first measurement process of measuring a frequency characteristic of a reference filter unit selected among the filter units; and an adjustment process of adjusting a frequency characteristic of each of remaining filter units selected among the filter units excluding the reference filter unit. Further, the adjustment process includes an attachment process of attaching a capacitive member for adjusting a capacitance between wirings in each of the remaining filter units; a second measurement process of measuring a frequency characteristic of each of the remaining filter units to which the capacitive member is attached; and an individual adjustment process of adjusting a capacitance of the capacitive member such that the frequency characteristic of each of the remaining filter unit to which the capacitive member is attached is adjusted to be close to the frequency characteristic of the reference filter unit.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of an adjustment method for a filter unit and a plasma processing apparatus will be described in detail with reference to the accompanying drawings. It should be noted that the adjustment method for the filter unit and the plasma processing apparatus disclosed herein are not limited by the following embodiments.

A distributed constant type filter connected to an electrical member such as a heater includes passive components such as a coil and the like. A stray capacitor exists in a gap between such passive components and a metal housing covering the filter. Therefore, a value of the stray capacitor as well as the constants of the passive components affects the frequency characteristics of the filter.

Further, if the high frequency powers attenuated by the filters respectively connected to the heaters are different from one another, it may affect the uniformity of plasma distribution. For this reason, it is preferable that the frequency characteristics of the filters respectively provided to the heaters are the same.

However, it may be difficult to make a distance between the filter and the metal housing equal in each filter due to the restriction on a layout accompanying scaling-down of the plasma processing apparatus. For this reason, it is difficult to set the stray capacitance in each filter to the same value. As a result, the frequency characteristics of the filters respectively provided to the heaters may be different from each other, thereby deteriorating the uniformity of the plasma distribution.

Therefore, the present disclosure provides a technique capable of reducing the difference in frequency characteristics between the filter units respectively provided to the electrical members.

First Embodiment

Configuration of Plasma Etching Apparatus 1

Figure 1:
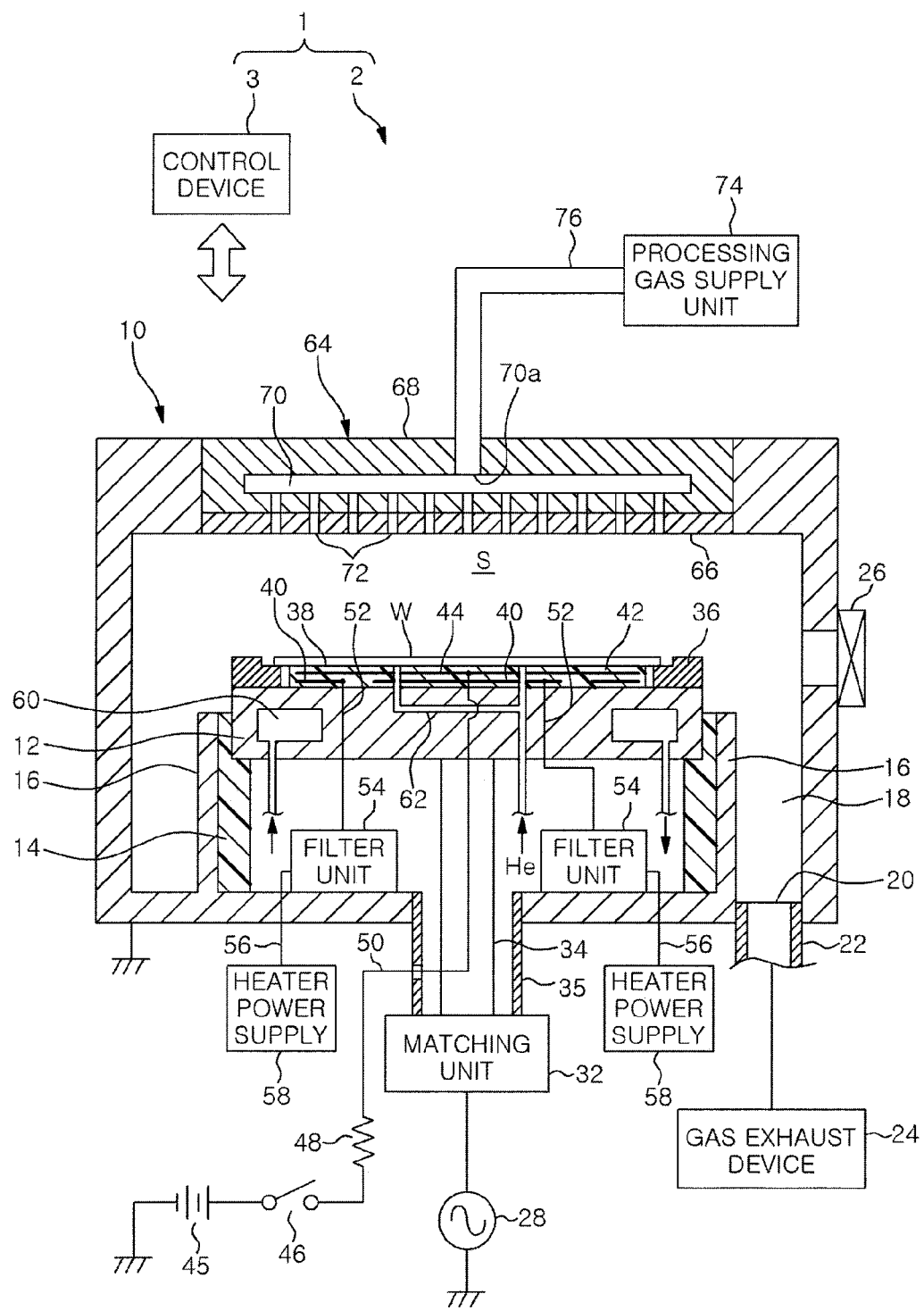
FIG. 1 is a cross-sectional view schematically showing an example of a plasma etching apparatus according to a first embodiment of the present disclosure.

FIG. 1 is a cross-sectional view schematically showing an example of a plasma etching apparatus 1 according to a first embodiment of the present disclosure. The plasma etching apparatus 1 in the first embodiment is configured as a capacitively-coupled plasma processing apparatus. The plasma etching apparatus 1 includes an apparatus main body 2 and a control device 3.

The apparatus main body 2 includes a chamber 10 having a substantially cylindrical shape. The chamber is made of, e.g., aluminum, stainless steel or the like. The chamber 10 is frame-grounded. In the chamber 10, a substantially disk-shaped susceptor 12 is disposed. The susceptor 12 is made of, e.g., aluminum or the like and serves as a lower electrode. The susceptor 12 is supported by a cylindrical support member 14 extending vertically upward from a bottom portion of the chamber 10. The support member 14 is made of an insulating member such as ceramic or the like. Thus, the support member 14 is electrically isolated from the chamber 10.

A conductive cylindrical support portion 16 is provided at an outer periphery of the support member 14. The support portion 16 extends vertically upward from the bottom portion of the chamber 10 along the outer periphery of the support member 14. An annular gas exhaust passage 18 is formed between the cylindrical support portion 16 and an inner wall of the chamber 10. At a bottom portion of the gas exhaust passage 18, a gas exhaust port 20 is provided. A gas exhaust device 24 having a turbo molecular pump or the like is connected to the gas exhaust port 20 through a gas exhaust line 22. By operating the gas exhaust device 24, a processing space in the chamber 10 is depressurized to a desired vacuum level. An opening is formed at a sidewall of the chamber 10. A semiconductor wafer W, which is an example of a target substrate to be processed, is loaded and unloaded through the opening, and the opening is opened and closed by a gate valve 26.

A high frequency power supply 28 is electrically connected to the susceptor 12 through a matching unit 32 and a power feeding rod 34. The high frequency power supply 28 is configured to supply high frequency power to the susceptor 12 through the matching unit 32 and the power feeding rod 34. The high frequency power has a first frequency mainly contributing to plasma generation. The first frequency is, e.g., 27 MHz or more, and preferably 60 MHz or more. The matching unit 32 performs impedance matching between the high frequency power supply 28 and a plasma load.

The power feeding rod 34 is a substantially columnar conductor. An upper end of the power feeding rod 34 is connected to a central portion of a bottom surface of the susceptor 12. A lower end of the power feeding rod 34 is connected to the matching unit 32. In addition, a substantially cylindrical conductor cover 35 having an inner diameter larger than an outer diameter of the power feeding rod 34 is disposed around the power feeding rod 34. An upper end of the cover 35 is connected to an opening formed in the bottom portion of the chamber 10, and a lower end of the cover 35 is connected to a housing of the matching unit 32.

An edge ring 36 and an electrostatic chuck 38 are disposed on the susceptor 12. The semiconductor wafer W is mounted on a top surface of the electrostatic chuck 38. The electrostatic chuck 38 is an example of a stage. The edge ring 36 may be referred to as a focus ring. The edge ring has a substantially annular outer shape, and the electrostatic chuck 38 has a substantially disk-like outer shape. The edge ring 36 is disposed to surround the electrostatic chuck 38. The edge ring 36 is made of, e.g., silicon (Si), silicon carbide (SiC), carbon (C), silicon dioxide ($SiO_2$), or the like.

The electrostatic chuck 38 has a plurality of heaters 40, a dielectric member 42, and an electrode 44. Each heater 40 is an example of an electrical member. The heaters 40 and the electrode 44 are embedded in the dielectric member 42. A DC power supply 45 disposed outside the chamber 10 is electrically connected to the electrode 44 through a switch 46, a resistor 48 and a wiring 50. The semiconductor wafer W is attracted and held on the top surface of the electrostatic chuck 38 by a Coulomb force generated by a DC voltage applied from the DC power supply 45 to the electrode 44. The wiring 50 is coated with an insulator. The wiring 50 passes through the inside of the power feeding rod 34 and penetrates the susceptor 12 from the bottom of the susceptor 12 to be connected to the electrode 44 of the electrostatic chuck 38.

Figure 2:
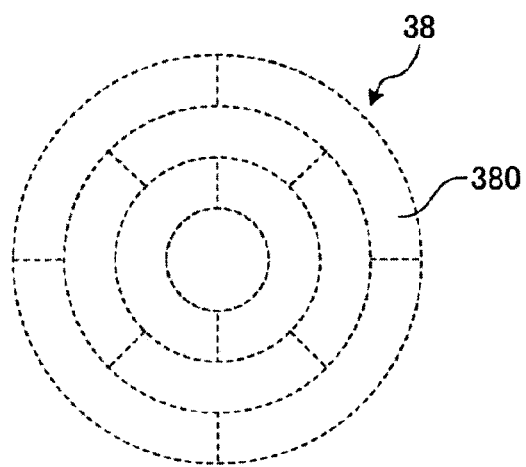
FIG. 2 is a top view showing an example of the divided regions of an electrostatic chuck.

Each of the heaters 40 may be, e.g., a spiral-shaped resistance heating wire. For example, the top surface of the electrostatic chuck 38 is divided into multiple regions 380 as shown in FIG. 2. FIG. 2 is a top view showing an example of the divided regions of the electrostatic chuck 38. The heaters 40 are arranged in the multiple regions 380, respectively. A filter unit 54 is connected to each of the heaters 40 through a wiring 52 coated with an insulator. Each filter unit 54 is connected to a heater power supply 58 through a wiring 56 coated with an insulator. The heater power supply 58 is an example of an external circuit.

In the plasma etching apparatus 1 shown in FIG. 1, two wirings 52, two filter units 54, two wirings 56, and two heater power supplies 58 are illustrated. However, in practice, the wirings 52, the filter units 54, the wirings 56, and the heater power supplies 58 are provided in the same number as the number of the heaters 40 provided to correspond to the regions 380 shown in FIG. 2. Alternatively, one heater power supply 58 may be shared by the heaters 40 to supply power to each of the heaters 40 through each of the wirings 56, the filter units 54 and the wirings 56 corresponding thereto. Each of the filter units 54 will be described later in detail.

An annular flow path 60 is formed in the susceptor 12. The flow path 60 is supplied with a coolant from a chiller unit (not shown) and the coolant is circulated therein. The susceptor 12 is cooled by the coolant circulated in the flow path 60 and the electrostatic chuck 38 disposed on the susceptor 12 is cooled. The susceptor 12 and the electrostatic chuck 38 are provided with a gas line 62 for supplying a heat transfer gas such as He gas to a gap between the electrostatic chuck 38 and the semiconductor wafer W. A heat transfer rate between the electrostatic chuck 38 and the semiconductor wafer W is controlled by controlling a pressure of the heat transfer gas supplied to the gap between the electrostatic chuck 38 and the semiconductor wafer W through the gas line 62.

A shower head 64 is provided at a ceiling portion of the chamber 10 to be opposite to the susceptor 12. The shower head 64 serves as an upper electrode opposite to the susceptor 12 serving as the lower electrode. A plasma generation space S is formed between the shower head 64 and the susceptor 12. The shower head 64 includes an electrode plate 66 facing the susceptor 12 and a holding body 68 that detachably holds the electrode plate 66 from above. The electrode plate 66 is made of, e.g., Si, SiC, C, or the like. The holding body 68 is made of, e.g., alumite-treated aluminum.

A gas diffusion space 70 is formed in the holding body 68. A plurality of gas injection holes 72 are formed to extend through the electrode plate 66 and the holding body 68 from the gas diffusion space 70 to the susceptor 12. A gas inlet port 70a communicating with the gas diffusion space 70 is provided at an upper portion of the holding body 68. A processing gas supply unit 74 is connected to the gas inlet port 70a through a gas line 76. The processing gas supply unit 74 includes gas supply sources for supplying various gases. Each of the gas supply sources is connected to a flow rate controller, a valve, and the like. Then, various gases are individually supplied into the plasma generation space S after the flow rates thereof are controlled by the respective flow rate controllers.

The respective components of the apparatus main body 2 are controlled by a control device 3 including, e.g., memory, a processor, and an input/output interface. A control program, a processing recipe, and the like are stored in the memory. The processor reads out and executes the control program from the memory and controls the respective components of the apparatus main body 2 through the input/output interface based on the processing recipe stored in the memory. By controlling the respective components, the plasma etching apparatus 1 performs an etching using plasma on the semiconductor wafer W.

For example, the gate valve 26 is opened, and the semiconductor wafer W that is a target object to be processed is loaded into the chamber 10 by a transfer device (not shown) and mounted on the electrostatic chuck 38. Then, the semiconductor wafer W is attracted and held on the top surface of the electrostatic chuck 38 by controlling the switch 46 to be turned on. Further, the coolant is supplied and circulated in the flow path 60 from the chiller unit (not shown), and the heat transfer gas is supplied to the gap between the electrostatic chuck 38 and the semiconductor wafer W through the gas line 62. Then, electric power is supplied from the heater power supply 58 corresponding to each of the heaters 40. The electric power supplied to each of the heaters 40 is controlled independently by the control device 3. Therefore, the temperature distribution of the semiconductor wafer W can be controlled.

Then, the processing gas is supplied from the processing gas supply unit 74 into the chamber 10 at a predetermined flow rate, and the pressure in the chamber 10 is controlled to a desired level by the gas exhaust device 24. Further, plasma of the processing gas is generated in the plasma generation space S by supplying a high frequency power of a predetermined power level from the high frequency power supply 28 to the susceptor 12 through the matching unit 32 and the power feeding rod 34. Then, the semiconductor wafer W is etched by ions and radicals contained in the plasma.

Detailed Configuration of Filter Unit 54

Figure 3A:
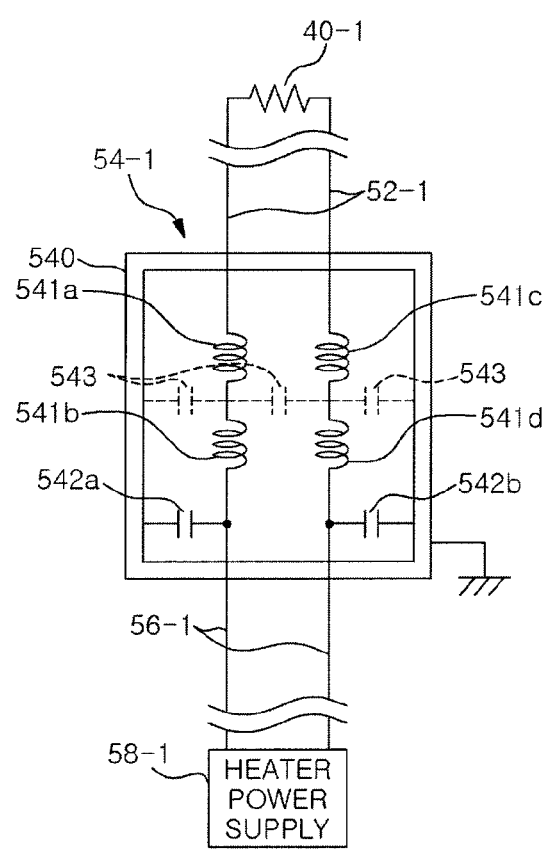
FIGS. 3A and 3B each show an example of a filter unit according to the first embodiment of the present disclosure.
Figure 3B:
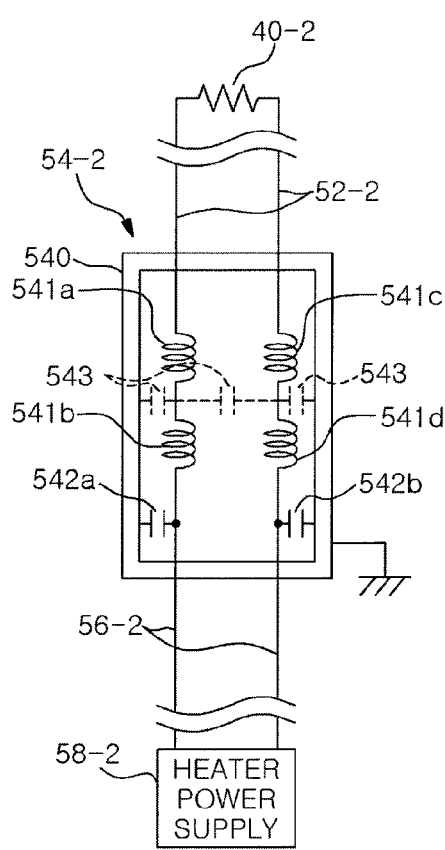

FIGS. 3A and 3B show examples of the plurality of the filter units 54 according to the first embodiment of the present disclosure. FIG. 3A shows one filter unit 54-1 among the filter units 54, and FIG. 3B shows another filter unit 54-2 among the filter units 54. The filter unit 54-1 is connected to a heater 40-1 through wirings 52-1 and is connected to a heater power supply 58-1 through wirings 56-1. The filter unit 54-2 is connected to a heater 40-2 through wirings 52-2 and is connected to a heater power supply 58-2 through wirings 56-2.

For example, as shown in FIGS. 3A and 3B, each of the filter unit 54-1 and the filter unit 54-2 includes a metal housing 540, a coil 541a, a coil 541b, a coil 541c, a coil 541d, a capacitor 542a, and a capacitor 542b. Hereinafter, the coil 541a, the coil 541b, the coil 541c, and the coil 541d are collectively referred to as "coil 541" unless otherwise distinguished. In addition, the capacitor 542a and the capacitor 542b are collectively referred to as "capacitor 542" unless otherwise distinguished. The plurality of the coils 541 and the plurality of the capacitors 542 are accommodated in the metal housing 540, and the metal housing 540 is grounded.

In the examples of FIGS. 3A and 3B, four coils 541 and two capacitors 542 are accommodated in the metal housing 540. The coil 541a and the coil 541b are connected in series in one wiring in the metal housing 540, and the coil 541c and the coil 541d are connected in series in the other wiring in the metal housing 540. In the present embodiment, the coils 541a and 541b connected in series are configured as coils with unequal pitches (that is, the pitches thereof are not uniform). However, the configuration of the coils is not limited thereto, and it may be possible to configure the coil 541a and the coil 541b connected in series as one coil having an equal pitch. The capacitor 542a is connected between one wiring in the metal housing 540 and the metal housing 540, and the capacitor 542b is connected between the other wiring in the metal housing 540 and the metal housing 540. However, the number of coils and the number of capacitors are not limited thereto. The number of coils connected in series to each wiring in the metal housing 540 may be three or more, and the number of capacitors connected between each wiring in the metal housing 540 and the metal housing 540 may be two or more.

In one wiring in the metal housing 540, the coils 541a and 541b connected in series and the capacitor 542a constitute an LC filter. Further, in the other wiring in the metal housing 540, the coils 541c and 541d connected in series and the capacitor 542b constitute an LC filter. These LC filters attenuate a predetermined frequency power flowing thereinto through the heater 40. There also exist stray capacitors 543 between the wirings in the metal housing 540 and between each of the wirings in the metal housing 540 and the metal housing 540. Therefore, the frequency characteristics of the filter unit 54 are the frequency characteristics of a circuit configured by the plurality of the coils 541, the plurality of the capacitors 542, and the stray capacitors 543.

For example, in the case where "$L_t$" is the total inductance of the two coils 541, and "$C_t$" is the total capacitance of the capacitor 542 and the stray capacitor 543, a resonance frequency f of the LC filter in each wiring in the metal housing 540 is expressed by, e.g., the following equation (1):

$$f = \frac{1}{2\pi\sqrt{L_t C_t}}. \qquad (1)$$

Further, the capacitance C of the capacitor is generally expressed by the following equation (2):

$$C = \varepsilon \frac{S}{d} \qquad (2)$$

where "d" is the distance between the electrodes, "S" is the area of the electrode, and "ε" is the permittivity of a dielectric medium between the electrodes.

Here, along with the trend toward scaling-down of the plasma etching apparatus 1, the shape and the size of a place where each of the filter units 54 is disposed may be restricted. Accordingly, it may be difficult to allow the metal housings 540 to have the same size. Therefore, for example, as shown in FIGS. 3A and 3B, there may be a case where a relatively large-size metal housing 540 such as the filter unit 54-1 can be used or a case where a relatively small-size metal housing 540 such as the filter unit 54-2 has to be used depending on the place where it is arranged.

When the shape or the size of the metal housing 540 is changed, the distance between the wiring (or the coil 541) and the metal housing 540 is also changed. When the wiring (or the coil 541) and the metal housing 540 are regarded as electrodes, according to the equation (2), a capacitance $C_s$ of the stray capacitor 543 between the wiring (or the coil 541) and the metal housing 540 depends on a distance $d_s$ between the wiring (or the coil 541) and the metal housing 540. Therefore, in the case where the shape or the size of the metal housing 540 is changed, even if the constants of the coils 541 and the capacitors 542 in the plurality of filter units 54 are equal, if capacitances $C_s$ of the stray capacitors in the filter units 54 are different from one another, the frequency characteristics of the LC filters become different from one another.

Figure 4:
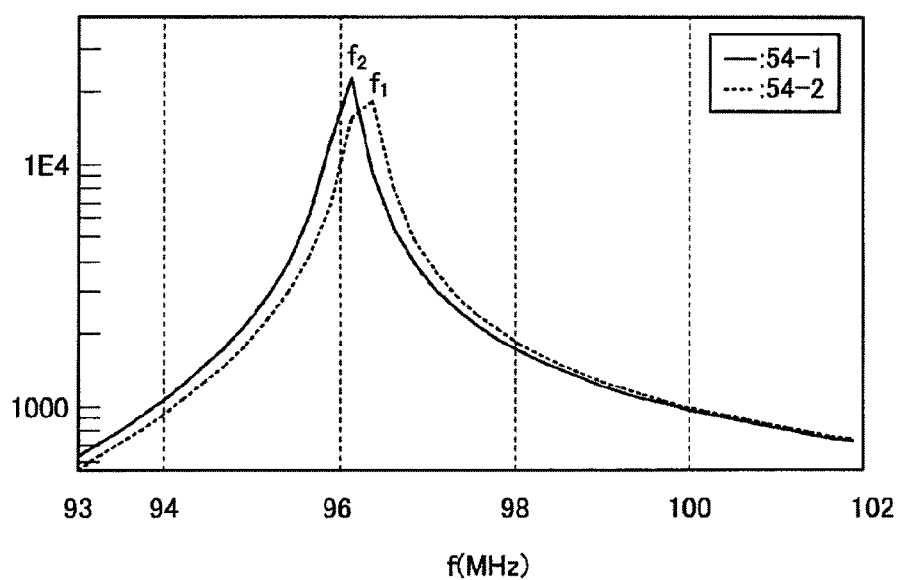
FIG. 4 shows an example of the frequency characteristics of an impedance of the filter unit.

Specifically, since the capacitances $C_s$ of the stray capacitors 543 are different, the total capacitances $C_t$ of the filter units 54 are different from one another. When the total capacitances $C_t$ of the filter units 54 are different from one another, the resonance frequencies f in the equation (1) are different from one another. FIG. 4 shows an example of the frequency characteristics of the impedance of each of the filter unit 54-1 and the filter unit 54-2. For example, as shown in FIG. 4, a resonance frequency $f_1$ of the filter unit 54-1 having a longer distance $d_s$ between the wiring (or the coil 541) and the metal housing 540 is higher than a resonance frequency $f_2$ of the filter unit 54-2 having a shorter distance $d_s$.

As a result, the resonance frequency f deviates from a frequency $f_0$ of the high frequency power applied to the susceptor 12 from the high frequency power supply 28, which makes it difficult to sufficiently attenuate the high frequency power flowing into the heater power supply 58. Further, in the filter units 54, the resonance frequencies f deviate depending on the shape and the size of the metal housing 540, resulting in the increase of the difference in the attenuation amount of the high frequency power among the filter units 54. This reduces the uniformity of the plasma distribution and reduces the accuracy of the plasma processing.

Therefore, in the present embodiment, the difference in the frequency characteristics among the filter units 54 is reduced by individually adjusting the capacitances of the filter units 54. For example, in the case of the filter unit 54 including the stray capacitor 543 having a small capacitance, the capacitance between the wiring (or the coil 541) and the metal housing 540 is adjusted to be increased. As a result, it becomes possible to improve the uniformity of the plasma distribution and the accuracy of the plasma processing.

Figure 5:
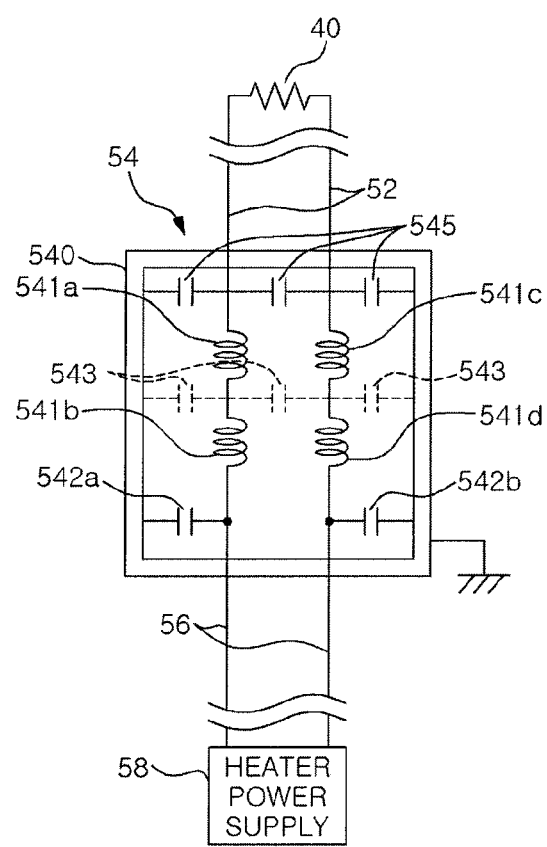
FIG. 5 shows an example of a filter unit to which a capacitive member is attached.

For example, as shown in FIG. 5, the capacitance between the wiring (or the coil 541) and the metal housing 540 is increased by attaching a capacitive member 545 into the filter unit 54. FIG. 5 shows an example of the filter unit 54 to which the capacitive member 545 is attached. In the example of FIG. 5, the capacitive member 545 is attached to the wirings 52 in the metal housing 540. However, the present disclosure is not limited thereto, and the capacitive member 545 may be connected to the wirings 52 disposed outside of the metal housing 540.

Figure 6:
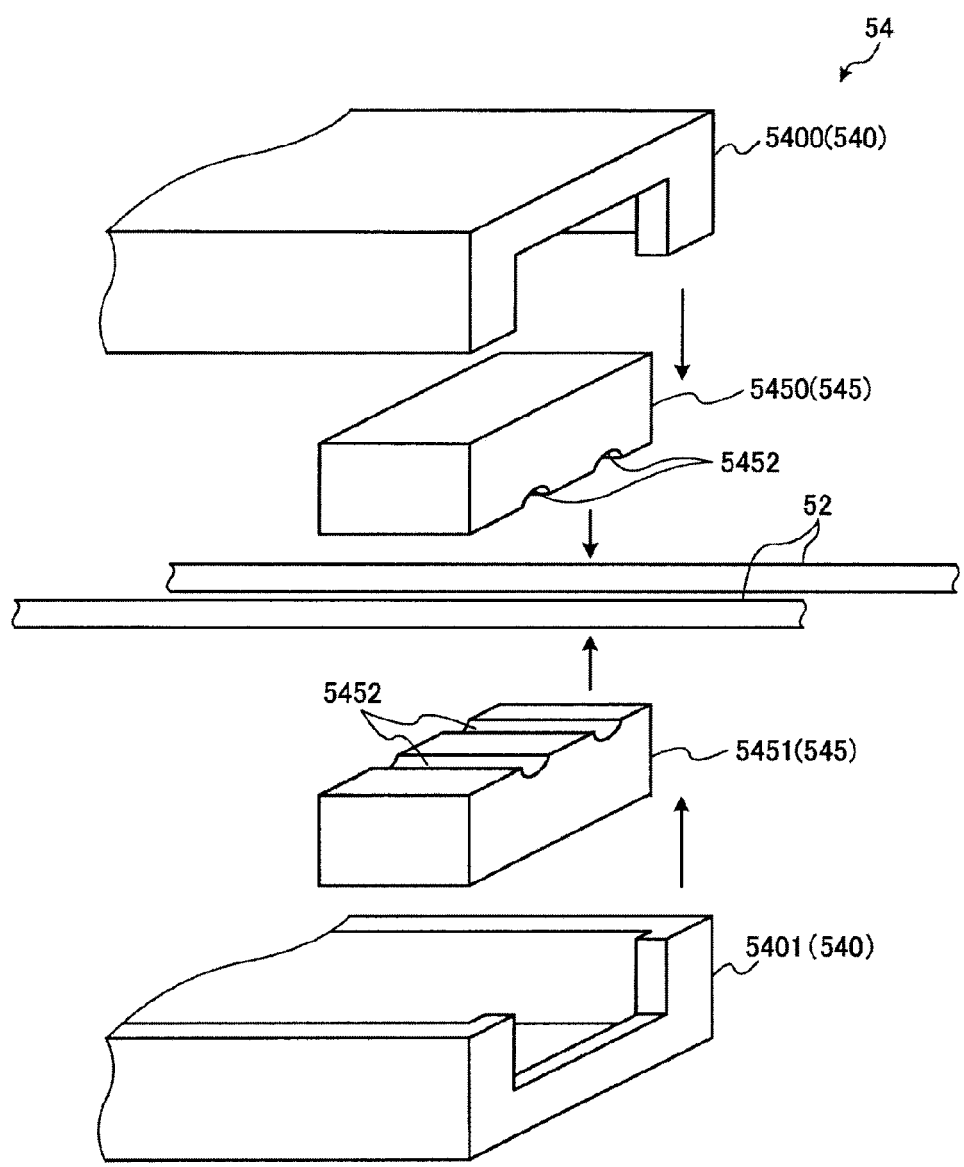
FIG. 6 is an exploded perspective view showing an example of a metal housing, the capacitive member and the wirings.

FIG. 6 is an exploded perspective view showing an example of the metal housing 540, the capacitive member 545 and the wirings 52. The metal housing 540 is divided into a first division housing 5400 and a second division housing 5401. Further, the capacitive member 545 is a block-shaped dielectric member and is divided into a first division member 5450 and a second division member 5451. In each of the first division member 5450 and the second division member 5451, grooves 5452 are formed to respectively arrange the wirings 52 therein.

Figure 7:
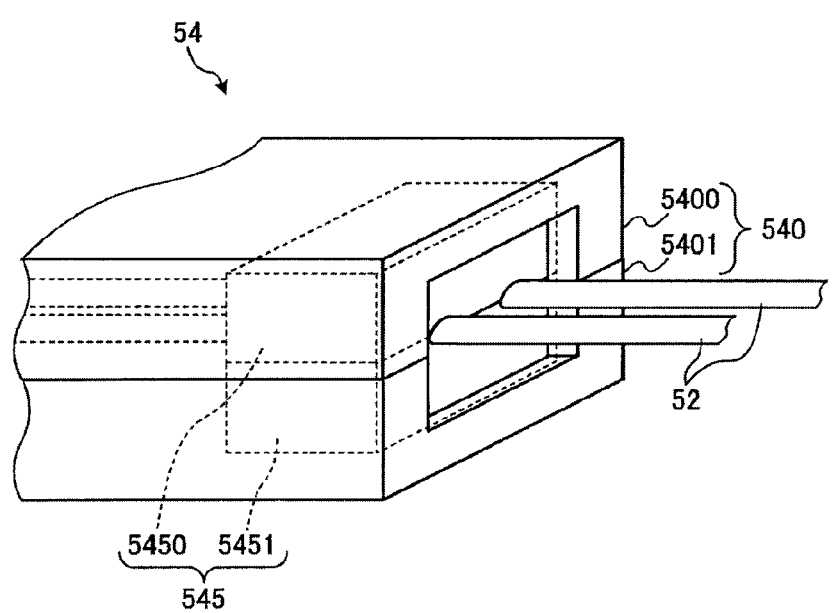
FIG. 7 shows an example of the filter unit to which the capacitive member is attached.

The wirings 52 are arranged in the respective grooves 5452, and the first division member 5450 and the second division member 5451 lie one on top of the other with the wirings 52 interposed therebetween. Then, the first division housing 5400 and the second division housing 5401 lie one on top of the other so as to interpose therebetween the capacitive member 545 having the wirings 52 therein. Therefore, for example, the capacitive member 545 is accommodated in the filter unit 54, as shown in FIG. 7. Thus, since the capacitive member 545 has a structure in which the wirings 52 are interposed therein, the capacitive member 545 can be easily attached and detached. Alternatively, the capacitive member 545 may have a structure with through holes formed in the capacitive member 545 to allow the wirings 52 to pass therethrough.

The capacitive member 545 is made of, e.g., Polychlorotrifluoroethylene (PCTFE), Polyether ether ketone (PEEK), or Polyphenylene sulfide (PPS).

The permittivity ε of an arbitrary dielectric material is expressed as "$\varepsilon = \varepsilon_0 \varepsilon_r$," where "$\varepsilon_0$" is the vacuum permittivity and "$\varepsilon_r$" is the relative permittivity defined based on the vacuum permittivity $\varepsilon_0$. The relative permittivity $\varepsilon_r$ of air is equal to about 1. The relative permittivity $\varepsilon_r$ of the PCTFE is equal to about 2.6. The relative permittivity $s_r$ of the PEEK is equal to about 3.2. The relative permittivity $\varepsilon_r$ of the PPS is equal to about 3.6. As shown in the equation (2), the capacitance C can be changed when the dielectric medium having a different permittivity ε is interposed between the electrodes.

In the filter unit 54 having a relatively small-sized metal housing 540, the distance between the wiring (or the coil 541) and the metal housing 540 is short, so that the capacitance $C_s$ of the stray capacitor 543 is large and the resonance frequency f becomes low. On the other hand, in the filter unit 54 having a relatively large-sized metal housing 540, the distance between the wiring (or the coil 541) and the metal housing 540 is long, so that the capacitance $C_s$ of the stray capacitor 543 is small and the resonance frequency f becomes high. Therefore, in the filter unit 54 having the relatively large-sized metal housing 540, the capacitance C between the wiring (or the coil 541) and the metal housing 540 can be adjusted to be increased by attaching the capacitive member 545 made of a material having a permittivity ε larger than that of air. With such a configuration, the resonance frequency f can be lowered. Therefore, the difference in the resonance frequency f between the filter units 54 can be reduced.

Further, by adjusting the shape and the size of the capacitive member 545, the size of the gap between the capacitive member 545 and the metal housing 540 can be adjusted. When the gap between the capacitive member 545 and the metal housing 540 is changed, the distance d shown in the equation (2) is changed, resulting in the change of the capacitance C between the wiring (or the coil 541) and the metal housing 540. Consequently, the resonance frequency f of the plurality of the filter unit 54 can be changed.

For example, in the filter unit 54 having the relatively large-sized metal housing 540, the gap between the capacitive member 545 and the metal housing 540 is reduced in size when the capacitive member 545 is attached to the filter unit 54. When the gap between the capacitive member 545 and the metal housing 540 is reduced, the distance d shown in the equation (2) is reduced. As the distance d is reduced, the capacitance C between the wiring (or the coil 541) and the metal housing 540 is increased and the resonance frequency f is lowered. As described above, the difference in the resonance frequency f between the filter units 54 can be reduced by adjusting the shape and the size of the capacitive member 545.

Adjustment Method for Filter Unit 54

Figure 8:
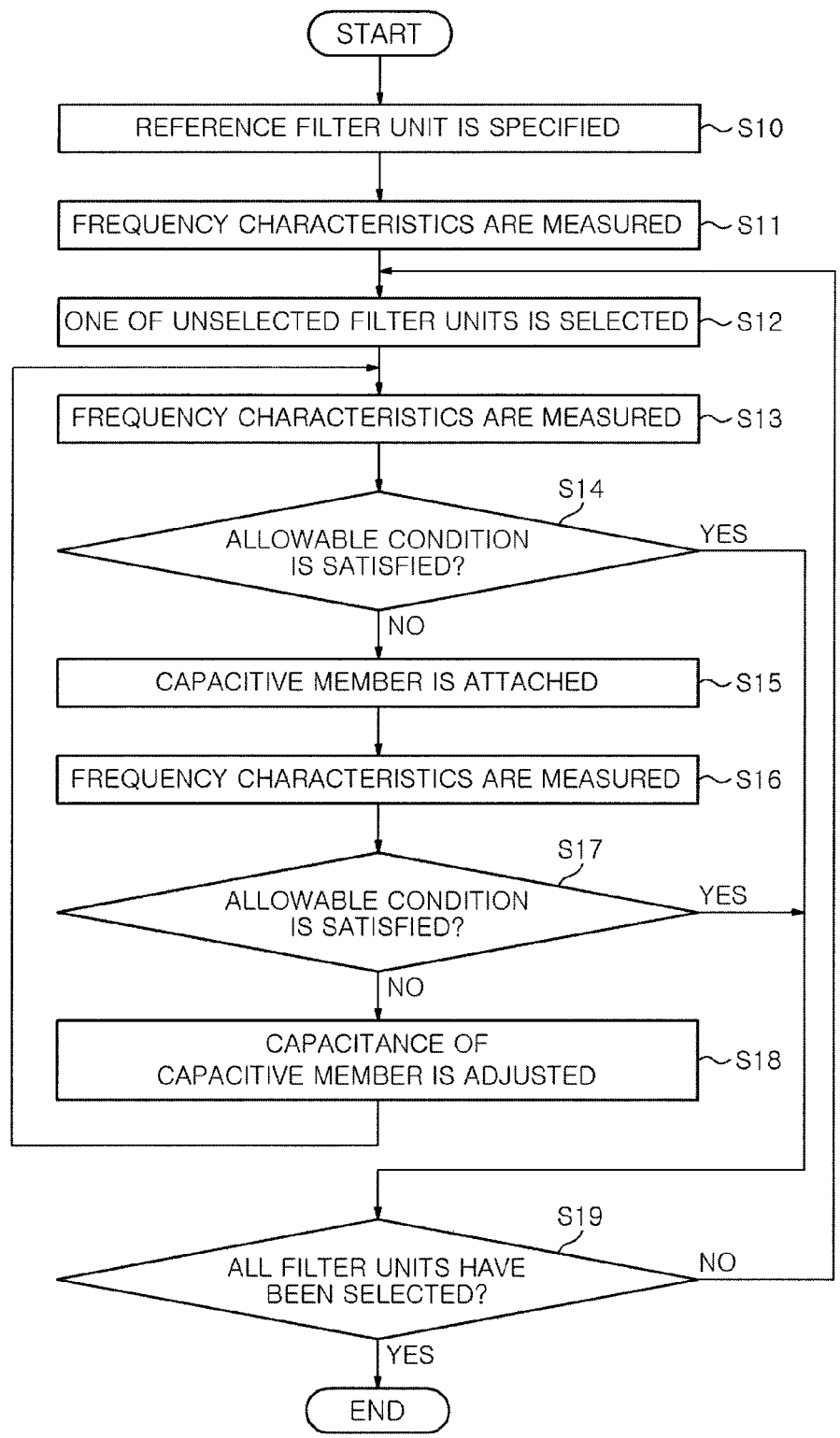
FIG. 8 is a flowchart illustrating an example of a method for adjusting the filter unit according to the first embodiment of the present disclosure.

FIG. 8 is a flowchart illustrating an example of a method for adjusting the filter unit 54 according to the first embodiment of the present disclosure. For example, the adjustment method shown in FIG. 8 is performed when the plasma etching apparatus 1 is assembled, but may be performed periodically after the plasma etching apparatus 1 is assembled.

First, among the plurality of the filter units 54, a reference filter unit 54 is specified (step S10). For example, the filter unit 54 having the smallest gap between the coil 541 and the metal housing 540 is specified as the reference filter unit 54. Then, the frequency characteristics of the reference filter unit 54 are measured around a first frequency by using, e.g., a network analyzer or the like (step S11). Step S11 is an example of a first measurement process.

Figure 13:
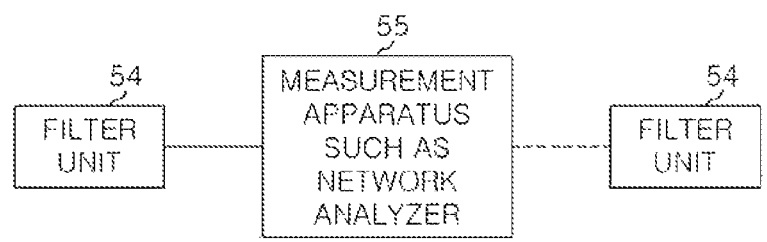
FIG. 13 schematically represents a measurement apparatus connected to filter units.

Next, one of the filter units 54 that has not been selected is selected among the filter units 54 excluding the reference filter unit 54 (step S12). The filter unit 54 selected in step S12 has a gap between the coil 541 and the metal housing 540 greater than the reference filter unit 54. Then, the frequency characteristics of the filter unit 54 selected in step S12 are measured around the first frequency by using, e.g., the network analyzer or the like (step S13). FIG. 13 schematically represents a measurement apparatus (e.g., a network analyzer) 55, connected to a filter 54 for step S11 represented in solid line, and thereafter, to a filter 54 for step S13 (as well as, e.g., S16 discussed below) represented in broken line.

Thereafter, it is determined whether or not the frequency characteristics of the filter unit 54 selected in step S12 satisfy an allowable condition (step S14). For example, when the difference between the resonance frequency f of the reference filter unit 54 and the resonance frequency f of the filter unit 54 selected in step S12 is less than a predetermined value, it is determined that the allowable condition is satisfied. The predetermined value is, e.g., several tens of kHz.

Meanwhile, depending on a structure of the coil 541, the impedance may vary considerably around the resonance frequency. The coil 541 having such a structure has a large impedance change even when the difference in the resonance frequency is small. Therefore, in the coil 541 having the structure in which the impedance varies considerably around the resonance frequency, the predetermined value is preferably set to a smaller value such as several kHz. On the other hand, in the coil 541 having a structure in which the impedance varies smoothly around the resonance frequency, the impedance is not greatly changed even if the difference in the resonance frequency is slightly large. Therefore, in the coil 541 having such a structure, the predetermined value is preferably set to a larger value such as several hundred kHz. Further, since the difference in the attenuation amount of the high frequency power among the plurality of the filter units 54 only needs to be small, it is not necessary to have the resonance frequencies f in the plurality of the filter units 54 coincide with one another.

If the frequency characteristics of the filter unit 54 selected in step S12 satisfy the allowable condition (YES in step S14), it is determined whether or not all of the filter units 54 have been selected among the filter units 54 excluding the reference filter unit 54 (step S19). If there is an unselected filter unit 54 (NO in step S19), the process shown in step S12 is executed again. On the other hand, when all of the filter units 54 have been selected (YES in step S19), the adjustment method for the filter unit 54 shown in FIG. 8 is terminated.

When the frequency characteristics of the filter unit 54 selected in step S12 do not satisfy the allowable condition (NO in step S14), the capacitive member 545 is attached to the filter unit 54 to adjust the capacitances of the wirings in the filter unit 54 (step S15). Step S15 is an example of an attachment process. Then, the frequency characteristics of the filter unit 54 to which the capacitive member 545 is attached are measured around the first frequency by using, e.g., the network analyzer or the like (step S16). Step S16 is an example of a second measurement process.

Next, it is determined whether or not the frequency characteristics of the filter unit 54 to which the capacitive member 545 is attached satisfy the allowable condition (step S17). When the frequency characteristics of the filter unit 54 to which the capacitive member 545 is attached satisfy the allowable condition (YES in step S17), the process shown in step S19 is executed.

On the other hand, when the frequency characteristics of the filter unit 54 to which the capacitive member 545 is attached do not satisfy the allowable condition (NO in step S17), the capacitance added by the capacitive member 545 is adjusted (step S18). Step S18 is an example of an individual adjustment process. The adjustment of the capacitance is performed by replacing the current capacitive member 545 with a new capacitive member 545 having a different permittivity s, or changing the shape or the size of the current capacitive member 545, for example. Then, the process shown in step S13 is executed again. Steps S13 to S18 are an example of an adjustment process.

The first embodiment has been described above. The adjustment method for the filter unit 54 in the first embodiment is an adjustment method for the filter unit 54 in the plasma etching apparatus 1. The adjustment method includes a first measurement process and an adjustment process. The plasma etching apparatus 1 includes a plurality of the heaters 40 provided in the chamber 10 in which a target object is processed by a generated plasma and one or more heater power supplies 58 provided outside the chamber 10 and connected to the heaters 40 through the filter units 54 each of which includes the coils 541. Each of the filter units 54 further includes the metal housing 540 that covers the filter provided therein. In the first measurement process, the frequency characteristics of the reference filter unit 54 selected among the filter units 54 are measured. In the adjustment process, the frequency characteristics of each of the remaining filter units 54 selected among the filter units 54 excluding the reference filter unit 54 are adjusted. The adjustment process includes an attachment process, a second measurement process and an individual adjustment process. In the attachment process, the capacitive member 545 is attached for adjusting the capacitance between the wirings in the filter unit 54. In the second measurement process, the frequency characteristics of the filter unit 54 to which the capacitive member 545 is attached are measured. In the individual adjustment process, the capacitance of the capacitive member 545 is adjusted such that the frequency characteristics of the filter unit 54 to which the capacitive member 545 is attached are adjusted to be close to the frequency characteristics of the reference filter unit 54. Therefore, the difference in frequency characteristic between the filter units 54 respectively provided to the heaters 40 can be reduced.

In the above-described embodiment, the reference filter unit 54 is the filter unit 54 having the smallest gap between the coils 541 and the metal housing 540 among the filter units 54. By attaching the capacitive member 545 having a permittivity ε larger than that of air to the filter unit 54 other than the reference filter unit 54, the frequency characteristics of the filter unit 54 to which the capacitive member 545 is attached become close to the frequency characteristics of the reference filter unit 54.

In the above-described embodiment, the capacitive member 545 is a dielectric member in which the wirings in the filter unit 54 are interposed. Therefore, an attachment and a removal of the capacitive member 545 to and from the filter unit 54 can be easily performed.

In the individual adjustment process of the above-described embodiment, the capacitance of the capacitive member 545 is adjusted by changing at least one of the material, the shape and the size of the capacitive member 545. Therefore, the frequency characteristics of the filter unit 54 to which the capacitive member 545 is attached can become close to the frequency characteristics of the reference filter unit 54.

In the above-described embodiment, each of the electrical members is the heater 40 provided in the electrostatic chuck 38 on which the semiconductor wafer W is mounted. As a result, the filter unit 54 can reduce the high frequency power flowing into the heater power supply 58 through the heater 40.

Second Embodiment

Configuration of Plasma Etching Apparatus 1

Figure 9:
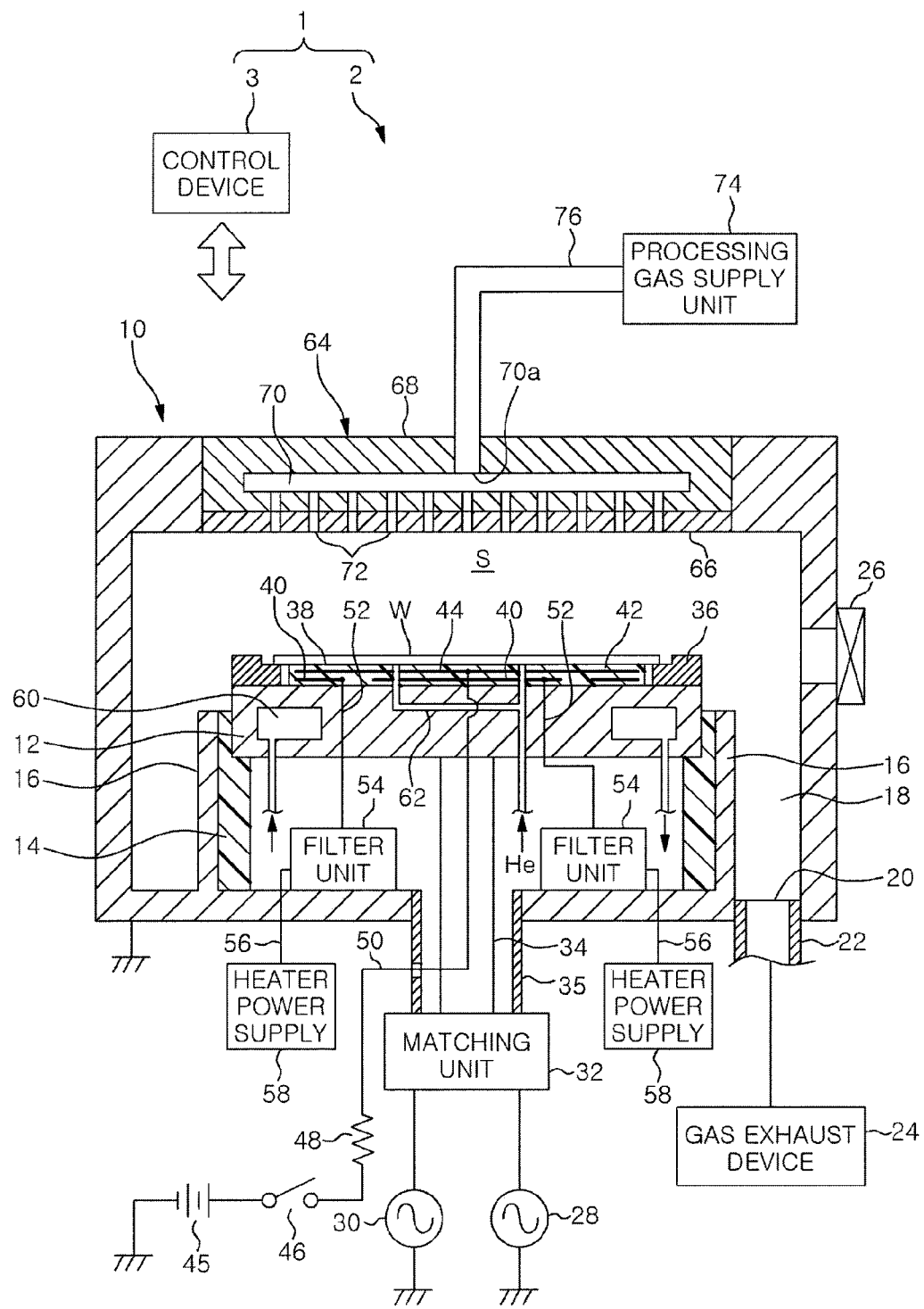
FIG. 9 is a cross-sectional view schematically showing an example of a plasma etching apparatus according to a second embodiment of the present disclosure.

FIG. 9 is a cross-sectional view schematically showing an example of a plasma etching apparatus 1 according to a second embodiment of the present disclosure. Except for those particularly described in the followings, in FIG. 9, like reference numerals are given to like parts having the same or similar functions described in FIG. 1, and redundant description thereof will be omitted. In the plasma etching apparatus 1 according to the present embodiment, the high frequency power supply 28 and a high frequency power supply are connected to the susceptor 12 through the power feeding rod 34 and the matching unit 32.

The high frequency power supply 30 is configured to supply high frequency power to the susceptor 12 through the matching unit 32 and the power feeding rod 34. The high frequency power has a second frequency (e.g., 13 MHz or less) that mainly contributes to ion attraction with respect to the semiconductor wafer W mounted on the susceptor 12. The matching unit 32 further performs an impedance matching between the high frequency power supply 30 and a plasma load.

Detail Configuration of Filter Unit 54

Figure 10:
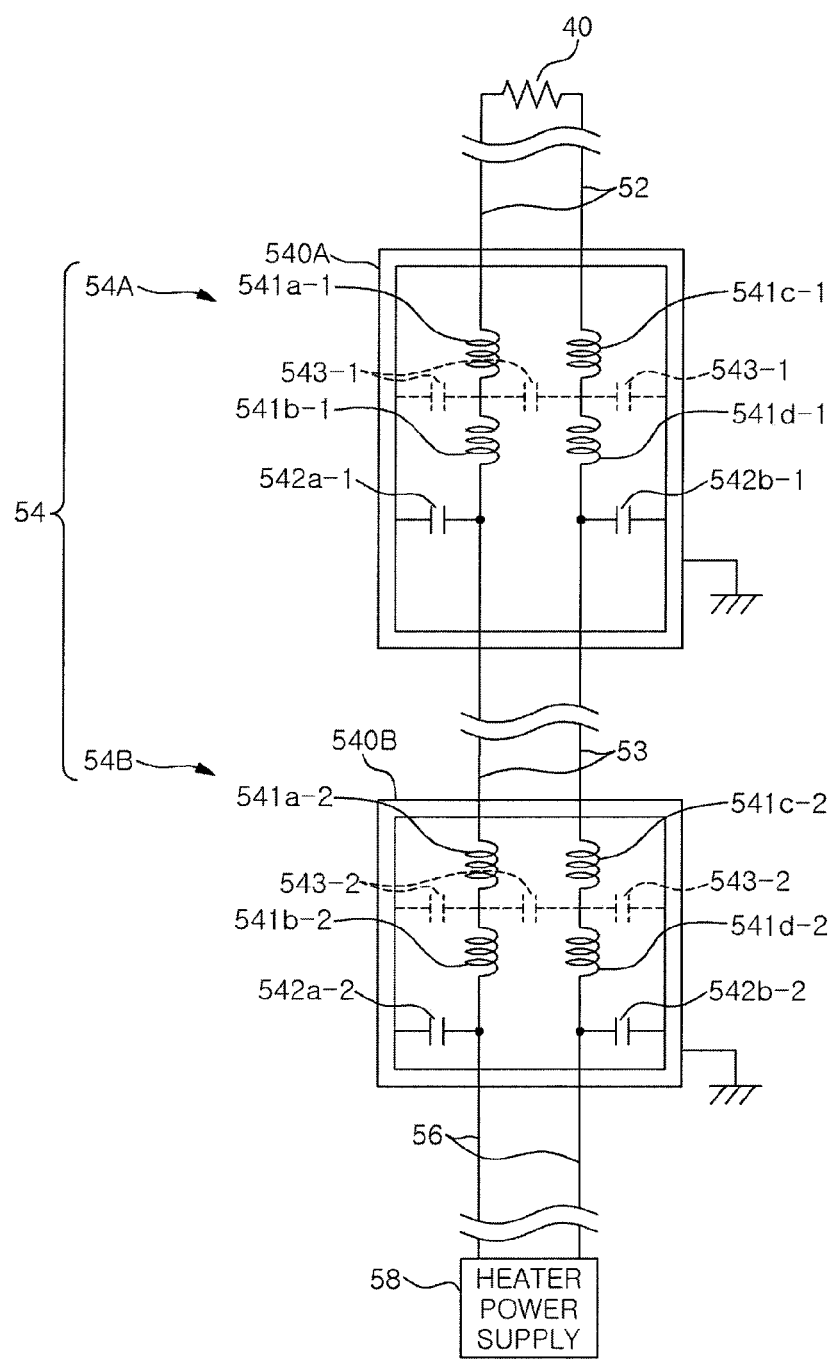
FIG. 10 shows an example of a filter unit according to the second embodiment of the present disclosure.

FIG. 10 shows an example of the filter unit 54 according to the second embodiment of the present disclosure. The filter unit 54 in the present embodiment includes a first unit 54A and a second unit 54B. In the present embodiment, the first unit 54A is configured to attenuate a component of the first frequency in the high frequency power flowing into the heater power supply 58 through the heater 40. Further, the second unit 54B is configured to attenuate a component of the second frequency in the high frequency power flowing into the heater power supply 58 through the heater 40. Therefore, the filter unit 54 in the present embodiment is configured to attenuate the components of the first frequency and the second frequency in the high frequency power flowing into the heater power supply 58 through the heater 40. Alternatively, the first unit 54A may attenuate the component of the second frequency in the high frequency power, and the second unit 54B may attenuate the component of the first frequency in the high frequency power.

The first unit 54A is connected to the heater 40 through the wirings 52 and is connected to the second unit 54B through wirings 53, each of which is coated with an insulator. The second unit 54B is connected to the first unit 54A through the wirings 53 and is connected to the heater power supply 58 through the wirings 56.

The first unit 54A includes a metal housing 540A, a coil 541a-1, a coil 541b-1, a coil 541c-1, a coil 541d-1, a capacitor 542a-1 and a capacitor 542b-1. Hereinafter, the coil 541a-1, the coil 541b-1, the coil 541c-1 and the coil 541d-1 are collectively referred to as "coil 541-1" unless otherwise distinguished. Further, the capacitor 542a-1 and the capacitor 542b-1 are collectively referred to as "capacitor 542-1" unless otherwise distinguished. The plurality of the coils 541-1 and the plurality of the capacitors 542-1 are accommodated in the metal housing 540A, and the metal housing 540A is grounded. There exist stray capacitors 543-1 between the wirings in the metal housing 540A, and between each of the wirings in the metal housing 540A and the metal housing 540A.

The second unit 54B includes a metal housing 540B, a coil 541a-2, a coil 541b-2, a coil 541c-2, a coil 541d-2, a capacitor 542a-2, and a capacitor 542b-2. Hereinafter, the coil 541a-2, the coil 541b-2, the coil 541c-2 and the coil 541d-2 are collectively referred to as "coil 541-2" unless otherwise distinguished. Further, the capacitor 542a-2 and the capacitor 542b-2 are collectively referred to as "capacitor 542-2" unless otherwise distinguished. The plurality of the coils 541-2 and the plurality of the capacitors 542-2 are accommodated in the metal housing 540B, and the metal housing 540B is grounded. There exist stray capacitors 543-2 between the wirings in the metal housing 540B, and between each of the wirings in the metal housing 540B and the metal housing 540B.

Figure 11:
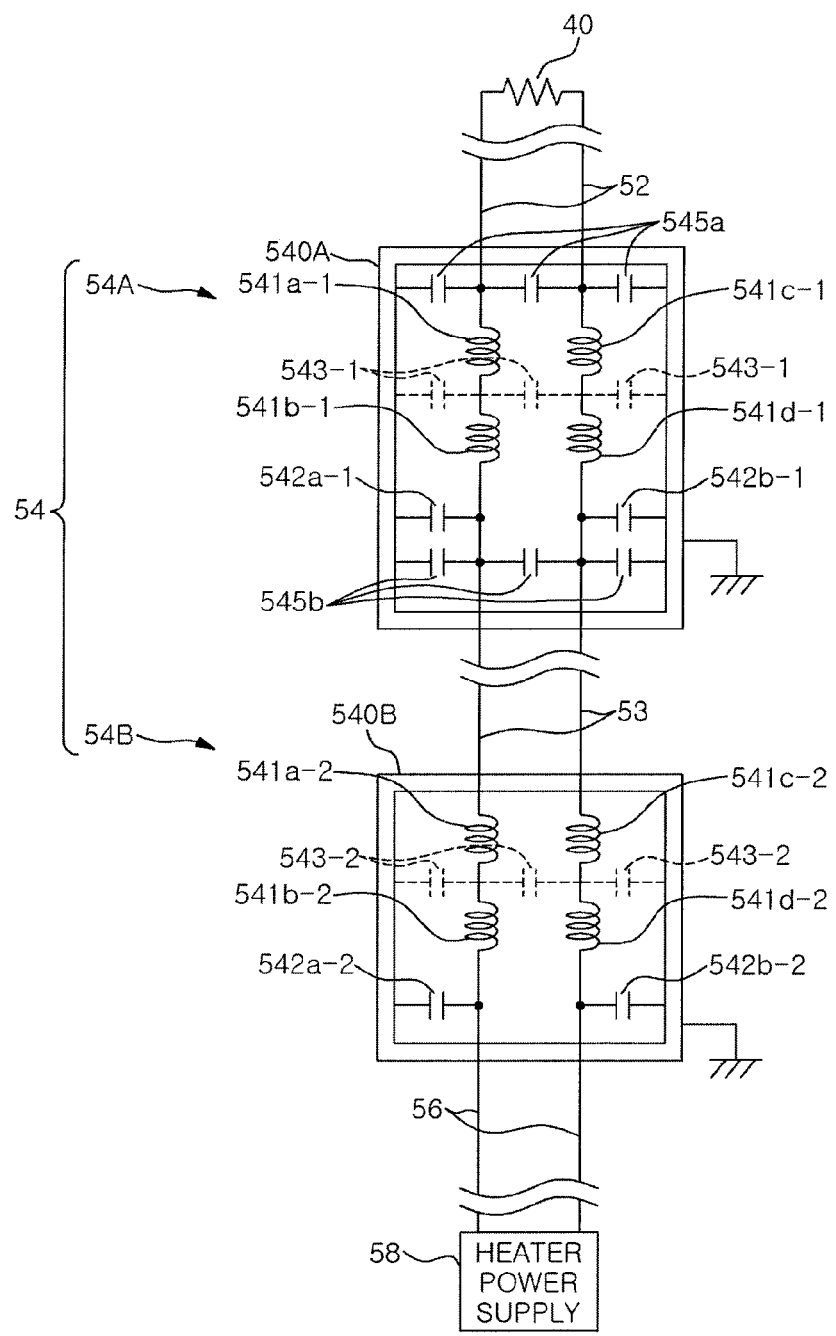
FIG. 11 shows an example of a filter unit to which a capacitive member is attached.

Here, along with the trend toward scaling-down of the plasma etching apparatus 1, it may be difficult to allow the metal housings 5410A in the first units 54A of the plurality of the filter units 54 to have the same size. If the stray capacitors 543-1 in the first units 54A of the filter units 54 are different from one another, the frequency characteristics of the first units 54A may be different from one another. Therefore, in the present embodiment, for example, a capacitive member 545*a* is attached to each of the first units 54A of the filter units 54 excluding the reference filter unit 54, as shown in FIG. 11. Therefore, the frequency characteristics of the filter unit 54 to which the capacitive member 545*a* is attached become close to the frequency characteristics of the reference filter unit 54 around the first frequency.

In the example shown in FIG. 11, the capacitive member 545*a* is attached to the wirings 52 in the metal housing 540A. However, the present disclosure is not limited thereto, and the capacitive member 545*a* may be attached to the wirings 52 outside the metal housing 540A.

Similarly to the first unit 54A, for the second units 54B of the plurality of the filter units 54, if the stray capacitors 543-2 in the second units 54B are different from one another, the frequency characteristics of the second units 54B may be different from one another. Therefore, in the present embodiment, for example, a capacitive member 545*b* is attached to the wirings 53 in each of the first units 54A connected to the second units 54B of the filter units 54 excluding the reference filter unit 54, as shown in FIG. 11. Therefore, the frequency characteristics of the filter unit 54 to which the capacitive member 545*b* is attached become close to the frequency characteristics of the reference filter unit 54 around the second frequency.

In the example shown in FIG. 11, the capacitive member 545*b* is attached to the wirings 53 in the metal housing 540A. However, the present disclosure is not limited thereto, and the capacitive member 545*b* may be attached to, e.g., the wirings 53 between the metal housing 540A and the metal housing 540B, or may be attached to, e.g., the wirings 53 in the metal housing 540B.

Adjustment Method for Filter Unit 54

Figure 12:
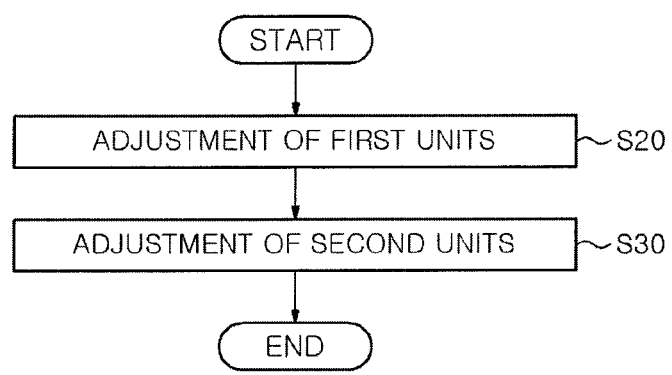
FIG. 12 is a flowchart illustrating an example of a method for adjusting the filter unit according to the second embodiment of the present disclosure.

FIG. 12 is a flowchart illustrating an example of a method for adjusting the filter unit 54 according to the second embodiment of the present disclosure. For example, the adjustment method shown in FIG. 12 is performed when the plasma etching apparatus 1 is assembled, but may be performed periodically after the plasma etching apparatus 1 is assembled.

First, the frequency characteristics of the first units 54A of the plurality of the filter units 54 around the first frequency are adjusted (step S20). In step S20, the same adjustment method as the adjustment method for the filter unit 54 shown in FIG. 8 is performed on the first units 54A of the filter units 54. Hereinafter, the process of step S20 will be described in detail with reference to FIG. 8.

First, among the first units 54A of the plurality of the filter units 54, a reference first unit 54A is specified (step S10). For example, the first unit 54A having the smallest gap between the coil 541-1 and the metal housing 540A is specified as the reference first unit 54A. Then, the frequency characteristics of the filter unit 54 including the reference first unit 54A are measured around a first frequency by using, e.g., a network analyzer or the like (step S11).

Next, one of the first units 54A that has not been selected is selected among the first units 54A excluding the reference first unit 54A (step S12). The first unit 54A selected in step S12 has a gap between the coil 541-1 and the metal housing 540A greater than the gap of the reference first unit 54A. Then, the frequency characteristics of the filter unit 54 including the first unit 54A selected in step S12 are measured around the first frequency by using, e.g., the network analyzer or the like (step S13).

Thereafter, it is determined whether or not the frequency characteristics of the filter unit 54 including the first unit 54A selected in step S12 satisfy an allowable condition (step S14). For example, when the difference between the resonance frequency f of the filter unit 54 including the reference first unit 54A and the resonance frequency f of the filter unit 54 including the first unit 54A selected in step S12 is less than a predetermined value, it is determined that the allowable condition is satisfied. The predetermined value is, e.g., several tens of kHz.

If the frequency characteristics of the filter unit 54 including the first unit 54A selected in step S12 satisfy the allowable condition (YES in step S14), it is determined whether or not all of the first units 54A have been selected (step S19). If there is an unselected first unit 54A (NO in step S19), the process shown in step S12 is executed again. On the other hand, when all of the first units 54A have been selected (YES in step S19), the adjustment method for the first unit 54A in step S20 is terminated.

When the frequency characteristics of the filter unit 54 including the first unit 54A selected in step S12 do not satisfy the allowable condition (NO in step S14), the capacitive member 545*a* is attached to the first unit 54A (step S15). Then, the frequency characteristics of the filter unit 54 including the first unit 54A to which the capacitive member 545*a* is attached are measured around the first frequency by using, e.g., the network analyzer or the like (step S16).

Next, it is determined whether or not the frequency characteristics of the filter unit 54 including the first unit 54A to which the capacitive member 545*a* is attached satisfy the allowable condition (step S17). When the frequency characteristics of the filter unit 54 including the first unit 54A to which the capacitive member 545*a* is attached satisfy the allowable condition (YES in step S17), the process shown in step S19 is executed.

On the other hand, when the frequency characteristics of the filter unit 54 including the first unit 54A to which the capacitive member 545*a* is attached does not satisfy the allowable condition (NO in step S17), the capacitance added by the capacitive member 545*a* is adjusted (step S18). The adjustment of the capacitance is performed by replacing the current capacitive member 545*a* with a new capacitive member 545*a* having a different permittivity s, or changing the shape or the size of the current capacitive member 545*a*. Then, the process shown in step S13 is executed again.

Next, the frequency characteristics of the second units 54B of the plurality of the filter units 54 around the second frequency are adjusted (step S30). In step S30, the same adjustment method as the adjustment method for the filter unit 54 shown in FIG. 8 is performed on the second units 54B of the filter units 54. Hereinafter, the detail process of step S30 will be described with reference to FIG. 8.

First, among the second units 54B of the plurality of the filter units 54, a reference second unit 54B is specified (step S10). For example, the second unit 54B having the smallest gap between the coil 541-2 and the metal housing 540B is specified as the reference second unit 54B. Then, the frequency characteristics of the filter unit 54 including the reference second unit 54B are measured around a second frequency by using, e.g., a network analyzer or the like (step S11).

Next, one of the second units 54B, which has not been selected, is selected among the second units 54B excluding the reference second unit 54B (step S12). The second unit 54B selected in step S12 has the gap between the coil 541-2 and the metal housing 540B greater than the reference second unit 54B. Then, the frequency characteristics of the filter unit 54 including the second unit 54B selected in step S12 are measured around the second frequency by using, e.g., the network analyzer or the like (step S13).

Thereafter, it is determined whether or not the frequency characteristics of the filter unit 54 including the second unit 54B selected in step S12 satisfies an allowable condition (step S14). For example, when the difference between the resonance frequency f of the filter unit 54 including the reference second unit 54B and the resonance frequency f of the filter unit 54 including the second unit 54B selected in step S12 is less than a predetermined value, it is determined that the allowable condition is satisfied. The predetermined value is, e.g., several tens of kHz.

If the frequency characteristics of the filter unit 54 including the second unit 54B selected in step S12 satisfy the allowable condition (YES in step S14), it is determined whether or not all of the second units 54B have been selected (step S19). If there is an unselected second unit 54B (NO in step S19), the process shown in step S12 is executed again. On the other hand, when all of the second units 54B have been selected (YES in step S19), the adjustment method for the second unit 54B in step S30 is terminated.

When the frequency characteristics of the filter unit 54 including the second unit 54B selected in step S12 do not satisfy the allowable condition (NO in step S14), the capacitive member 545b is attached to the first unit 54A connected to the second unit 54B (step S15). Then, the frequency characteristics of the filter unit 54 including the first unit 54A to which the capacitive member 545b is attached are measured around the second frequency by using, e.g., the network analyzer or the like (step S16).

Next, it is determined whether or not the frequency characteristics of the filter unit 54 including the first unit 54A to which the capacitive member 545b is attached satisfy the allowable condition (step S17). When the frequency characteristics of the filter unit 54 including the first unit 54A to which the capacitive member 545b is attached satisfy the allowable condition (YES in step S17), the process shown in step S19 is executed.

On the other hand, when the frequency characteristics of the filter unit 54 including the first unit 54A to which the capacitive member 545b is attached do not satisfy the allowable condition (NO in step S17), the capacitance added by the capacitive member 545b is adjusted (step S18). The adjustment of the capacitance is performed by replacing the current capacitive member 545b with a new capacitive member 545b having a different permittivity s, or changing the shape or the size of the capacitive member 545b. Then, the process shown in step S13 is executed again.

The second embodiment has been described above. The filter unit 54 in the second embodiment includes the first unit 54A and the second unit 54B. The first unit 54A is connected to the heater 40 and attenuates the first frequency component of the high frequency power flowing from the heater 40 to the heater power supply 58. The second unit 54B is connected between the first unit 54A and the heater power supply 58 and attenuates the second frequency component different from the first frequency component of the high frequency power. Therefore, it is possible to suppress the high frequency power including the first frequency component and the second frequency component from flowing from the heater 40 to the heater power supply 58.

Others

The techniques disclosed in the present application are not limited to the above-described embodiments, and various modifications may be made without departing from the scope and spirit of the present disclosure.

For example, in the first embodiment described above, by changing the material of the capacitive member 545 with the wirings 52 interposed therein, the frequency characteristics of the filter units 54 excluding the reference filter unit 54 are adjusted so as to be close to the frequency characteristics of the reference filter unit 54. However, the present disclosure is not limited thereto. For example, a variable capacitor whose capacitance can be continuously changed may be connected between the wirings in the metal housing 540 and between the wirings in the metal housing 540 and the metal housing 540. Then, the capacitance of the variable capacitor is adjusted to be continuously changed around a frequency of a first high frequency power such that the frequency characteristics of the filter units 54 excluding the reference filter unit 54 are close to the frequency characteristics of the reference filter unit 54.

Further, in the second embodiment described above, a variable capacitor is connected between the wirings in the metal housing 540 and between the wirings in the metal housing 540 and the metal housing 540. Then, the capacitance of the variable capacitor is adjusted to be continuously changed around a frequency of a second high frequency power such that the frequency characteristics of the filter units 54 excluding the reference filter unit 54 are close to the frequency characteristics of the reference filter unit 54. In this case, it is also possible to reduce the difference in the frequency characteristics between the filter units 54 respectively connected to the heaters 40.

In the above-described embodiments, the heater 40 has been described as an example of the electrical member. However, the present disclosure is not limited thereto. The electrical member may be a member other than the heater 40 as long as the member is provided in the chamber 10 and connected to an external circuit provided outside the chamber 10 through the filter unit 54. Examples of members other than the heater 40 include the electrode 44 provided in the electrostatic chuck 38 and various sensors (temperature sensor, pressure sensor and the like) provided in the chamber 10.

Further, in the above-described embodiments, the plasma etching apparatus 1 has been described as an example of the plasma processing apparatus, but the present disclosure is not limited thereto. As long as the apparatus performs the plasma processing, the techniques described in the present disclosure can be applied thereto. Examples of the apparatus include a film forming apparatus, a cleaning apparatus, or a modification apparatus.

Further, in the plasma etching apparatus 1 of the above-described embodiments, the capacitively-coupled plasma (CCP) is used as an example of a plasma source, but the present disclosure is not limited thereto. For example, inductively-coupled plasma (ICP), microwave excited surface wave plasma (SWP), electron cyclotron resonance plasma (ECP), helicon wave excited plasma (HWP), or the like may be used as the plasma source.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. An adjustment method for filter units in a plasma processing apparatus, wherein the plasma processing apparatus includes multiple electrical members provided in a chamber in which a target object is processed by a generated plasma, and one or more external circuits provided outside the chamber and connected to the multiple electrical members through the filter units each of which includes one or more coils and a metal housing that covers a filter provided therein, the adjustment method comprising:
   measuring a reference frequency characteristic of a reference filter unit selected among the filter units by using a network analyzer;
   measuring a frequency characteristic of each remaining filter unit of the filter units;
   adjusting the frequency characteristic of each remaining filter unit of the filter units, by
   attaching a capacitive member between the one or more coils and the metal housing;
   measuring the frequency characteristic of each of the remaining filter units to which the capacitive member is attached; and
   adjusting a capacitance of the capacitive member such that the frequency characteristic of each of the remaining filter units is close to the frequency characteristic of the reference filter unit.

2. The adjustment method of claim 1, wherein, among the filter units, the reference filter unit has the smallest gap between the one or more coils and the metal housing disposed therein.

3. The adjustment method of claim 1, wherein the capacitive member is a dielectric member in which wirings in each of the remaining filter units are interposed.

4. The adjustment method of claim 2, wherein the capacitive member is a dielectric member in which wirings in each of the remaining filter units are interposed.

5. The adjustment method of claim 3, wherein, in the adjusting a capacitance, the capacitance of the capacitive member is adjusted by changing at least one of a material, a shape and a size of the capacitive member.

6. The adjustment method of claim 4, wherein, in the adjusting a capacitance, the capacitance of the capacitive member is adjusted by changing at least one of a material, a shape and a size of the capacitive member.

7. The adjustment method of claim 1, wherein each of the filter units includes
   a first unit connected to a corresponding one of the electrical members and configured to attenuate a first frequency component of a high frequency power flowing from the corresponding one of the electrical members into a corresponding one of the external circuits, and
   a second unit connected between the first unit and the corresponding one of the external circuits and configured to attenuate a second frequency component different from the first frequency component of the high frequency power,
   wherein the capacitive member is attached between the first unit and the corresponding one of the electrical members and/or between the first unit and the second unit.

8. The adjustment method of claim 2, wherein each of the filter units includes
   a first unit connected to a corresponding one of the electrical members and configured to attenuate a first frequency component of a high frequency power flowing from the corresponding one of the electrical members into a corresponding one of the external circuits, and
   a second unit connected between the first unit and the corresponding one of the external circuits and configured to attenuate a second frequency component different from the first frequency component of the high frequency power,
   wherein the capacitive member is attached between the first unit and the corresponding one of the electrical members and/or between the first unit and the second unit.

9. The adjustment method of claim 1, wherein each of the electrical members is a heater provided in a stage on which the target object is mounted.

10. The adjustment method of claim 2, wherein each of the electrical members is a heater provided in a stage on which the target object is mounted.

11. An adjustment method for filter units in a plasma processing apparatus, wherein the plasma processing apparatus includes multiple electrical members provided in a chamber in which a target object is processed by a generated plasma, and one or more external circuits provided outside the chamber and connected to the multiple electrical members through the filter units, the filter units including a reference filter unit and at least one remaining filter unit, each filter unit including a wiring, one or more coils and a metal housing that covers a filter provided therein, the adjustment method comprising:
   measuring a frequency characteristic of the reference filter unit by a measurement apparatus;
   measuring a frequency characteristic of the at least one remaining filter unit by the measurement apparatus; and
   adjusting a capacitance of the at least one remaining filter unit such that the frequency characteristic of the at least one remaining filter unit is close to the frequency characteristic of the reference filter unit, the adjusting including; attaching a capacitive member between the wiring and the housing in the at least one remaining filter unit, or replacing an existing capacitive member of the at least one remaining filter unit with a different capacitive member.

12. The adjustment method according to claim 11, wherein the measurement apparatus includes a network analyzer.

13. The adjustment method according to claim 11, wherein the adjusting includes replacing the existing capacitive member with the different capacitive member, the different capacitive member having at least one of a different permittivity, a different size or a different shape compared to the existing capacitive member.

* * * * *